United States Patent
Gorbold et al.

(10) Patent No.: US 8,515,699 B2
(45) Date of Patent: Aug. 20, 2013

(54) ACCURACY OF BATTERY MONITOR PARTS

(75) Inventors: Jeremy Richard Gorbold, Newbury (GB); Colin Charles Price, Newbury (GB); Michael C. W. Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 592 days.

(21) Appl. No.: 12/613,062

(22) Filed: Nov. 5, 2009

(65) Prior Publication Data
US 2011/0004427 A1    Jan. 6, 2011

Related U.S. Application Data

(60) Provisional application No. 61/222,578, filed on Jul. 2, 2009.

(51) Int. Cl.
*G01R 31/36* (2006.01)

(52) U.S. Cl.
USPC .......................................................... 702/63

(58) Field of Classification Search
USPC ............... 702/63–65, 85, 107, 182–184, 188; 324/426, 434
See application file for complete search history.

(56) References Cited

U.S. PATENT DOCUMENTS

| | | | |
|---|---|---|---|
| 2008/0012570 A1* | 1/2008 | Bucur | 324/426 |
| 2008/0180106 A1 | 7/2008 | Gorbold | |
| 2010/0283473 A1* | 11/2010 | Vandensande | 324/434 |

OTHER PUBLICATIONS

Analog Devices Inc., "Lithium Ion Battery Monitoring System," AD7280 Preliminary Technical Data Sheet, Rev. PrD, pp. 1-33, 2008.

* cited by examiner

*Primary Examiner* — Mohamed Charioui
(74) *Attorney, Agent, or Firm* — Kenyon & Kenyon LLP (57) ABSTRACT

Embodiments of the present invention provide a monitoring system that may include a plurality of monitors. Each may have a plurality of input pairs coupled to respective components of a component stack, wherein adjacent monitors each have an input pair coupled to a common component. Embodiments of the present invention provide an integrated circuit that may include a plurality of detectors to locally measure a first group of channels. The integrated circuit may also include a receiver operable to receive a measurement of at least one channel of the first group of channels, and a controller to calculate a correction factor based on the received measurement and a local measurement of the at least one channel and to correct all first group measurements with the correction factor.

26 Claims, 7 Drawing Sheets

ACCURACY OF BATTERY MONITOR PARTS

This application claims priority to U.S. Provisional Application Ser. No. 61/222,578 filed on Jul. 2, 2009, the entire contents of which are incorporated herein by reference.

This disclosure is related to U.S. patent application Ser. No. 12/011,615, filed Jan. 28, 2008 and published Jul. 31, 2008 as US publication no. 2008/0180106 (the '615 application), which is assigned to Analog Devices, Inc., the assignee of the present disclosure. The '615 application is incorporated into the present disclosure in its entirety.

BACKGROUND

Rechargeable batteries are used in many applications today. One such application is the use of batteries in hybrid or fully electric vehicles. Within these vehicles, a plurality of individual battery cells are arranged in series in order to build a battery stack having a desired output voltage. A large number of cells may be arranged in series such that, for example, the total potential difference developed across the battery stack is in the order of several hundred volts. Each cell typically only has a potential difference of a few volts (say 2 to 4 volts) developed across it. Although the cells are similar, they are not identical, so repeated charging and discharging cycles may develop unequal voltages across individual cells within the stack. Ideally, the voltage across each individual cell, or at least small group of cells, would be monitored such that the cells could be temporarily removed from a charging process if their terminal voltage gets too high or, alternatively, if the cell temperature becomes unduly elevated. It is also possible to preferentially discharge cells to reduce their voltage. Whilst it is feasible to build a single battery monitoring apparatus that can operate across the entire voltage range, for example 0 to 400 volts, developed across a stack, such devices are expensive.

Figure 1:
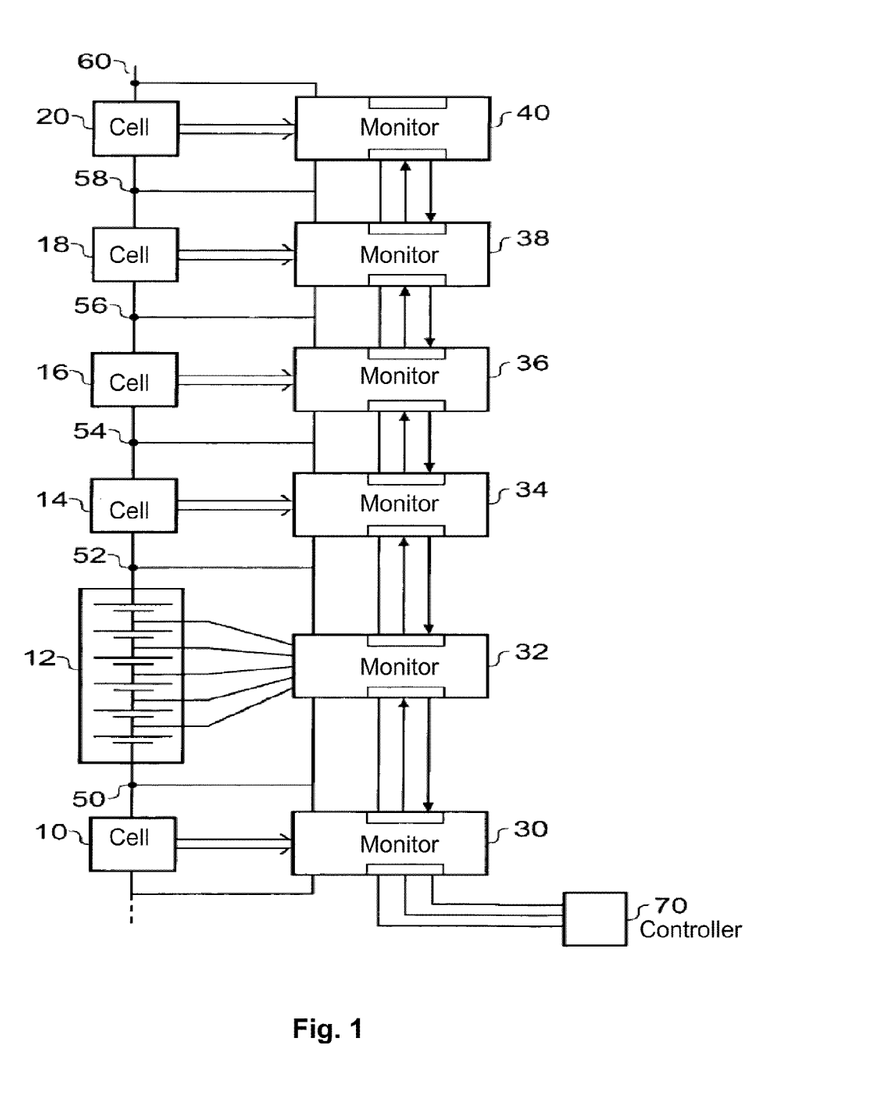
FIG. 1 illustrates a battery monitoring system.

FIG. 1 illustrates a battery monitoring system of the related '615 application that includes a plurality of battery monitors 30-40 provided in association with respective battery cell groups 10-20. Each battery monitor tests the voltages of its respective battery cell group and reports the voltage values to a system controller 70. The battery monitors 30-40 are provided in a so-called 'daisy chain' integrated circuits in which data to be read from given battery monitor (say, monitor 40) is be passed serially from each battery monitor to the next (38→36→34, etc.) until it reaches a battery monitor 30 at the end of the chain. Battery monitor 30 may pass the communicated data further to a system controller 70.

Data can be read from battery monitors 30-40 from any position of the daisy chain and communicated to the system controller 70. Moreover, data can be transmitted from the system controller 70 to a battery monitor 30-40 at any position of the daisy chain. Thus, the system controller 70 can read or write data to any position of the daisy chain and battery monitors at intermediate positions of the daisy chain will relay the communicated data from the source of the data to its destination.

Each battery monitor part may have a different reference value to test the cell voltage level, which could lead to measurement errors. Temperature, for example, can cause reference voltages in the battery monitor chips to change. Since each battery monitor measures a distinct cell group, measurement variations along cell groups may occur. For example, cell 10 and cell 18 may actually be at the same voltage, but reference voltage variations may cause the battery monitor parts to report different voltage readings of the cells. The voltage reading variations may lead to a significant statistical offset in the cell group measurements. One solution is to provide an external reference voltage for each battery monitor chip. However, this solution is extremely expensive for practical purposes because of the high cost of external reference voltages. Therefore, there is a need in the art to reduce battery monitor chip to chip variations while keeping the solution cost efficient.

DETAILED DESCRIPTION

Embodiments of the present invention provide a monitoring system that may include a plurality of monitors. Each may have a plurality of input pairs coupled to respective components of a component stack, wherein adjacent monitors each have an input pair coupled to a common component.

Embodiments of the present invention provide an integrated circuit that may include a plurality of detectors to locally measure a first group of channels. The integrated circuit may also include a receiver operable to receive a measurement of at least one channel of the first group of channels, and a controller to calculate a correction factor based on the received measurement and a local measurement of the at least one channel and to correct all first group measurements with the correction factor.

Embodiments of the present invention provide a calibration method for an integrated circuit. The method may include locally measuring voltages on a plurality of inputs of the integrated circuit and receiving data representing an external measurement of one of the voltages measured by the integrated circuit. The method may further include generating a correction factor from the external measure of the one voltage and the local measurement of the one voltage, and adjusting the locally measured voltages by the correction factor.

Embodiments of the present invention provide an integrated circuit that may include a plurality of detectors to measure a first group of channels with a coupled external reference voltage source. The integrated circuit may also include a transmitter to transmit a measurement of at least one channel of the first group of channels, wherein the transmitted measurement is to be used to calculate a correction factor for an adjacent integrated circuit.

Embodiments of the present invention provide a system controller that may include a receiver to receive measurements of respective components of a component stack, wherein adjacent monitoring devices measure a common component. The system controller may also include a processor to adjust all received measurements based on common component measurements.

Embodiments of the present invention provide a method that may include receiving a first set of measurement signals and receiving a second set of measurement signals, wherein the second set of measurement signals partially overlap with the first set of measurement signals. The method may further include calculating a correction factor based on the overlap measurement signals, and adjusting the second set of measurement signals based on the correction factor.

Figure 2:
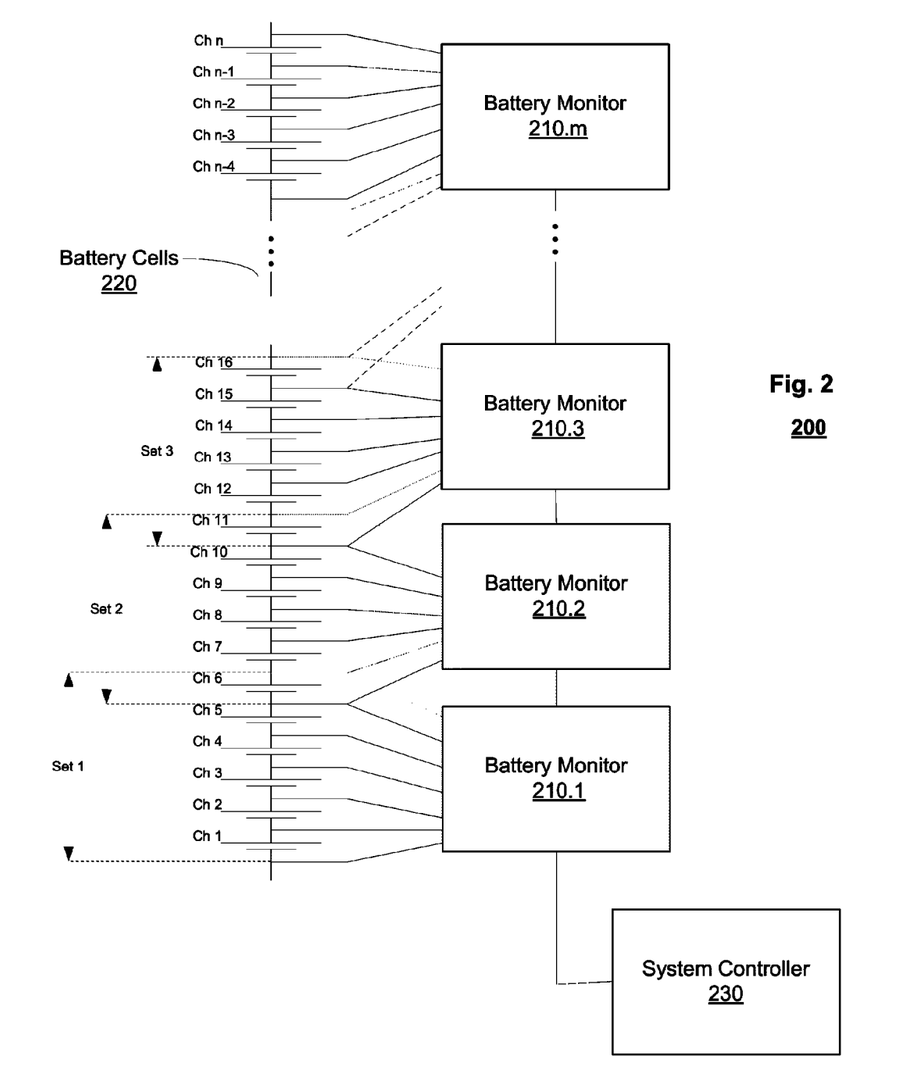
FIG. 2 illustrates a battery monitoring system according to an embodiment of the present invention.

FIG. 2 is a block diagram of a battery monitoring system 200 according to an embodiment of the present invention. Battery monitoring system 200 provides improved accuracy of battery monitor parts by using an overlap channel measurement technique. The battery monitoring system 200 may include battery monitors 210.1-210.*m*, a plurality of battery cells (called "channels" herein) 220, and a system controller 230. The system controller 230 may include a conventional processing system such as state machines, microprocessors, digital signal processors, or field programmable logic arrays (not shown).

The battery monitors 210.1-210.*m* may be communicatively connected to each other in a daisy chain fashion. In one embodiment, battery monitor 210.1 may be coupled to a first set of battery channels (Set 1). Battery monitor 210.2 may be coupled to a second set of battery channels (Set 2) that partially overlap with the channels of battery monitor 210.1. In a similar fashion, battery monitor 210.3 may be coupled to a third set of channels (Set 3) that partially overlap with the channel assignment of battery monitor 210.2. This channel overlap pattern may continue to battery monitor 210.*m* and battery channel n. The partial overlap may be one channel or may be a group of channels. For example, FIG. 2 shows channel 6 being the overlap portion between battery monitor 210.1 and battery monitor 210.2, and channel 11 being the overlap between battery monitor 210.2 and battery monitor 210.3. Therefore, each battery monitor chip may monitor k+1 channels to provide coverage of k channels per chip.

Figure 3:
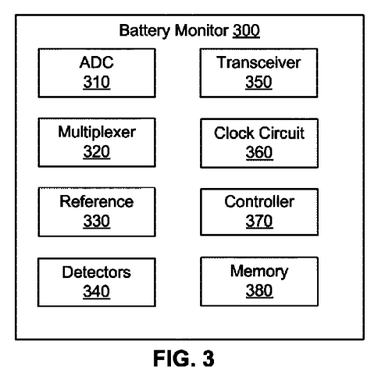
FIG. 3 is a simplified block diagram of battery monitor according to an embodiment of the present invention.

FIG. 3 is a simplified block diagram of a battery monitor 300 according to an embodiment of the invention. Each battery monitor 300 may be provided as an integrated circuit chip. The battery monitor 300 may include an analog to digital converter (ADC) 310, a multiplexer 320, an internal reference voltage 330, detectors 340, a clock circuit 360, a transceiver 350, a controller 370, and a memory 380. The detectors 340 may measure the battery cells coupled and generate analog measurements signals. The multiplexer 320 may receive the analog measurement signals and multiplex the analog measurement signals. The ADC 310 may convert the multiplexed analog measurement signals into digital representations using the internal reference voltage 330. The memory 380 may store the converted digital representations of the measurement signals. The clock circuit 360 may supply clock signals to the components in the battery monitor. The transceiver 350 may communicate with other battery monitor parts and the system controller using serial communication methods. The controller 370 may include control logic, data registers, and other modules to control the battery monitor operations. Further description of the battery monitor 300 may be found in the '615 application, which is incorporated into the present disclosure in its entirety.

Figure 4:
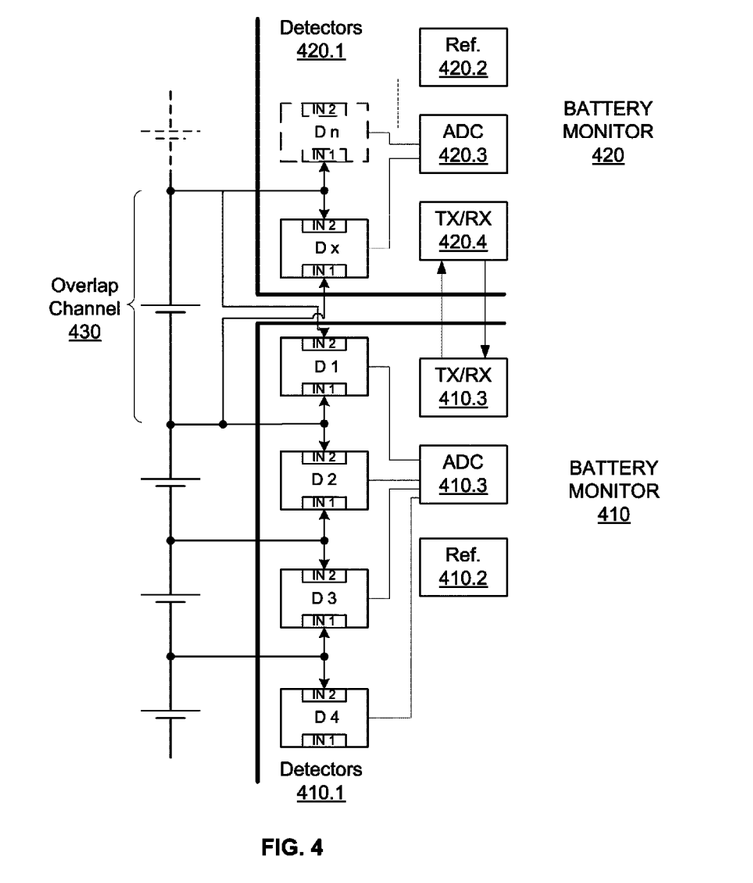
FIG. 4 illustrates an interface between two neighboring battery monitors according to an embodiment of the present invention.

FIG. 4 depicts an embodiment of an interface between two neighboring battery monitors 410, 420. Battery monitor 410, in this example, has a number of detectors 410.1, D1-D4, to receive the analog voltage signals from the battery channels. Each detector has two inputs, IN1 and IN2, coupled to a respective cathode and anode terminal of the battery channel being measured. The detector outputs may be multiplexed by a multiplexor (not shown) and sent to the ADC 410.3. The ADC 410.3 may then measure and convert the channel voltages using the internal reference voltage 410.2 on the battery monitor chip into digital measurement signals. The transceiver 410.3 may then transmit the digital measurement signals according to the controller's instructions. As shown in FIG. 4, one battery monitor 420 detector, D1, and one battery monitor 420 detector, Dx, may share the same inputs. The shared inputs are to the overlap channel's 430 cathode and anode terminals. Consequently, battery monitor 410 via detector D1 and battery monitor 420 via detector Dx may both measure the overlap channel 430.

Figure 5:
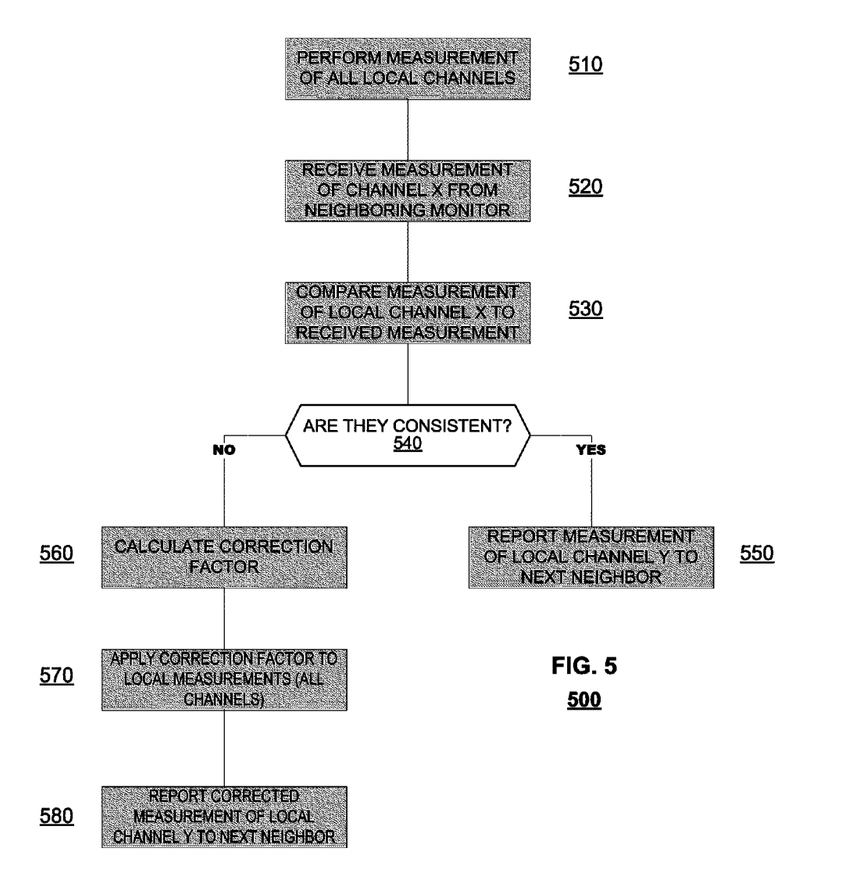
FIG. 5 is a simplified process flow for a battery monitoring system operation according to an embodiment of the present invention.

FIG. 5 illustrates a method 500 of how an individual battery monitor chip may operate according to an embodiment of the present invention. First, the battery monitor may perform measurements of all local battery channels (block 510). The battery monitor may receive measurement of channel x from its neighboring battery monitor (block 520). Channel x represents the overlap portion of the battery between these two neighboring battery monitors. The battery monitor may then compare the received channel x measurement to its local channel x measurement (block 530 and block 540). If the channel measurements are consistent, then battery monitor may report local channel y measurement to its other neighbor (block 550). Channel y represents the overlap portion of the battery between these two neighboring battery monitors.

However, if the channel x measurements are inconsistent, the battery monitor may calculate a correction factor based on the inconsistency (block 560). The correction factor may be calculated in a variety of processes. The correction factor, for example, may be calculated by taking the average of the two measurements and calculating the deviation from the average or may be calculated by taking the neighboring battery monitor's measurement as a reference value and calculating the deviation of the battery monitor channel x measurement from the reference value. Once the correction factor is calculated, the battery monitor may apply the correction to all local channel measurements (block 570). The battery monitor may then report the corrected channel measurement of local channel y to its other neighbor (block 580).

The correction process may be an additive/subtractive process. The correction process corrects offset errors because offset errors are additive errors. However, the correction process may also correct gain errors. Even though gain errors are multiplicative errors, the additive correction process may correct gain errors when gain errors are small enough to be approximated by incremental errors. Therefore, small multiplicative errors can be corrected by incremental adjustments.

Figure 6:
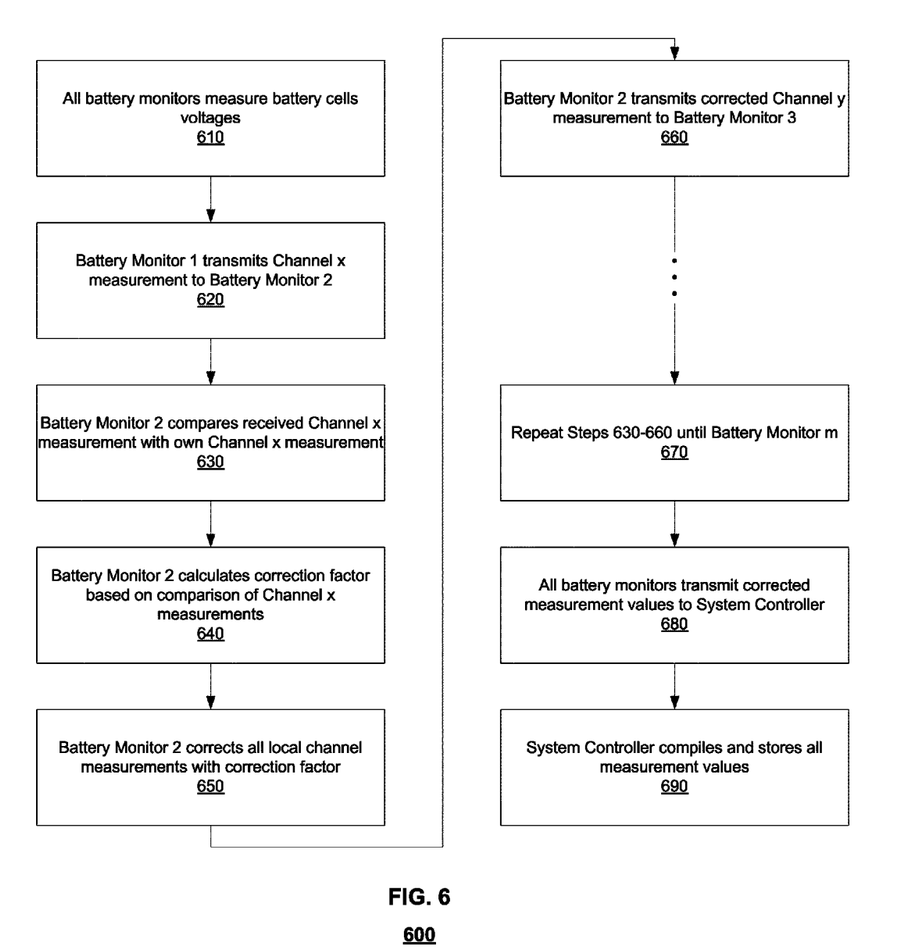
FIG. 6 is a simplified process flow for a battery monitor operation according to an embodiment of the present invention.

FIG. 6 illustrates one embodiment of how battery monitoring system 200 may operate. The method 600 may begin with all battery monitor parts measuring their coupled battery cell channels (Block 610). Battery monitor 210.1 may transmit its channel x measurement to battery monitor 210.2 (Block 620). Channel x represents an overlapped portion between battery monitor 210.1 and battery monitor 210.2. Battery monitor 210.2 may then compare the received channel x measurement with its own local channel x measurement (Block 630). Battery monitor 210.2 may then calculate a correction factor based on the channel x comparison (Block 640). The correction factor may be calculated in a variety of processes. The correction factor, for example, may be calculated by taking the average of the two measurements and calculating the deviation from the average or may be calculated by taking first battery monitor's measurement as a reference value and calculating the deviation of the second battery monitor channel x measurement from the reference value. After calculating the correction factor, battery monitor 210.2 may adjust all its local channel measurements with the correction factor (Block 650).

Battery monitor 210.2 may transmit its corrected channel y measurement to battery monitor 210.3 (Block 660). Channel y represents overlapped portion between battery monitor 210.2 and battery monitor 210.3. The method may repeat steps 630-660 with the other battery monitors until battery monitor m is reached. After battery monitor m has adjusted its channel measurements with its calculated correction factor, all battery monitors may transmit their corrected measurement values to the system controller (Block 680). The system controller may compile and store all received measurement values (Block 690).

In another embodiment, correction may be performed in the system controller instead of the individual battery monitors. In this embodiment, all measurement values may be transmitted to the system controller after the measurements are taken. The system controller using the overlapping channel measurements may calculate the correction factors for the relative channels and adjust corresponding channels accordingly. The corrections may be performed using an aggregate average of the overlapping channel measurements.

Figure 7:
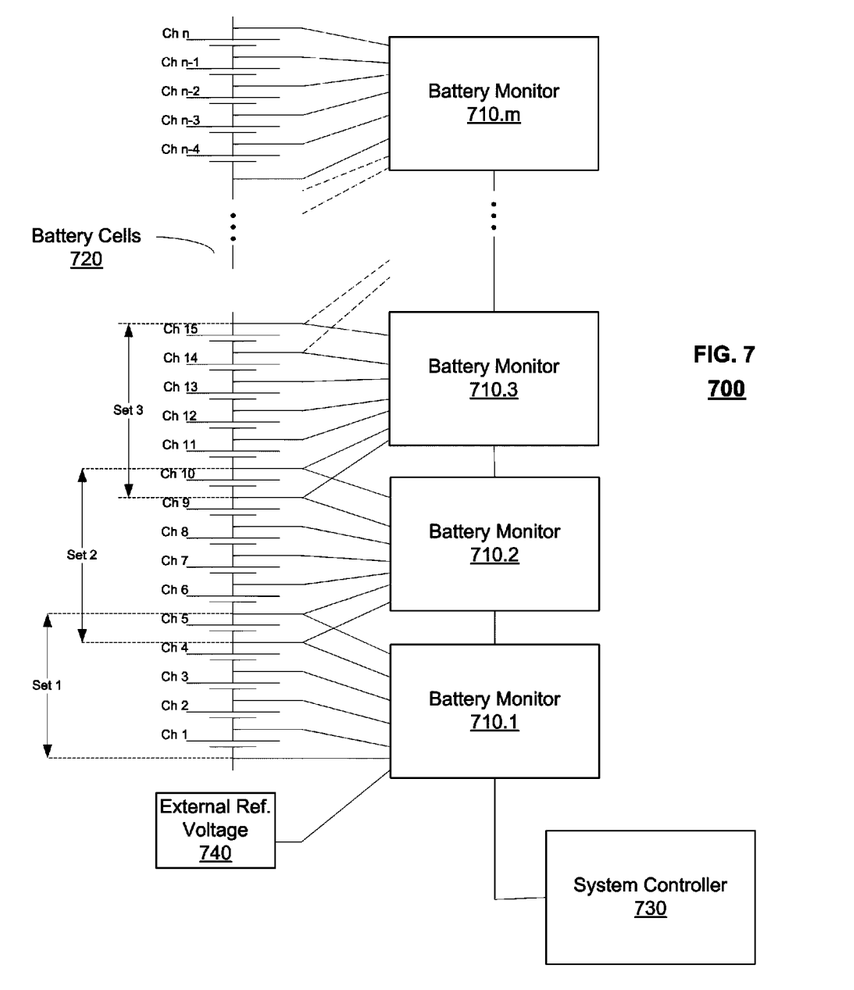
FIG. 7 illustrates a battery monitoring system according to an embodiment of the present invention.

FIG. 7 illustrates another embodiment of battery monitoring system 700. The battery monitoring system 700 may include battery monitors 710.1-710.m, battery cells 720, a system controller 730, and an external reference voltage 740. The system controller 730 may include a conventional processing system such as state machines, microprocessors, digital signal processors, and field programmable logic arrays (not shown).

Battery monitor 710.1 may be coupled to a first set of battery channels (Set 1) and the external reference voltage 740. Battery monitor 710.2 may be coupled to a second set of battery channels (Set 2) that partially overlap with the channels of battery monitor 710.1. In a similar fashion, battery monitor 710.3 may be coupled to a third set of channels (Set 3) that partially overlap with the channel assignment of battery monitor 710.2. This channel overlap pattern may continue to battery monitor 710.m and channel n. The partial overlap may be one channel or may be a group of channels.

During operation, battery monitoring system 700 may measure all channels at the same time with their coupled battery monitors. Battery monitor 710.1 may measure its local channels using the external reference voltage, which is comparatively far more accurate than the internal reference voltages in the battery monitors. Battery monitor 710.1 may transmit its channel x measurement to battery monitor 710.2. Channel x represents the overlap portion between battery monitor 710.1 and battery monitor 710.2. Since the first battery monitor's 710.1 channel x measurement was conducted with the more accurate external reference voltage, battery monitor 710.2 may calculate a correction factor using the deviation of its channel x measurement from the first battery monitor's 710.1 channel x measurement.

Battery monitor 710.2 may correct all its measurement values using the calculated correction factor and transmit corrected channel y measurement value to battery monitor 710.3. Channel y represents the overlap portion between battery monitor 710.2 and battery monitor 710.3. Battery monitor 710.3 may calculate a correction factor using the deviation of its channel y measurement from the second battery monitor's 710.2 channel y measurement. The operation may repeat until battery monitor 710.m is reached. After battery monitor 710.m has adjusted its channel measurements with its calculated correction factor, all battery monitors may transmit their corrected measurement values to the system controller. The system controller may compile and store all received measurement values.

Alternatively, correction may be performed in the system controller 730 instead of the individual battery monitors. All measurement values may be transmitted to the system controller immediately after the measurements are taken. The system controller using the overlapping channel measurements may calculate the correction factors for the relative channels and adjust the corresponding channels accordingly.

In the FIG. 7 embodiment, the battery monitoring system provides an accurate representation of the battery cell voltage levels as the battery cells are tested against an accurate external reference voltage. However, only one external reference voltage is used in the embodiment. Therefore, the overlap channel design provides a cost efficient accurate measurement, which otherwise would require an individual external reference voltage for each battery monitor.

Several embodiments of the present invention are specifically illustrated and described herein using an example of a battery monitoring system. However, it should be understood that the battery monitoring system example is used for narrative simplicity only and that the present invention applies equally well for a variety of other applications. The overlap channel design allows an ensemble of individual parts to compare their independent errors to derive corrections factors for the entire group. One application may be a signal processing stage with a plurality of amplifiers. Each amplifier may amplify a group of sub-bands (channels) of an input signal. The overlap channel design may be implemented so that one sub-band is shared with two amplifiers. Errors in amplifier signal processing stage may then be calculated using the overlap channel method described herein.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be implemented, for example, using a computer-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

We claim:

1. A monitoring system comprising:
a plurality of monitors, each having a plurality of input pairs, coupled to respective components of a component stack, that measure voltages of the components;
wherein adjacent monitors each have an input pair coupled to a common overlapping component of the stack; and
at least one of the monitors compares a measurement that it takes of an overlapping component to measurement data received from an adjacent monitor, representing the adjacent monitor's measurement of the overlapping component, to calculate a corresponding correction factor for the system.

2. The system of claim 1, wherein the components are battery cells and the component stack is a battery stack.

3. The monitoring system of claim 1, wherein a first monitor adjusts its voltage measurement of another overlapping component based on the correction factor and transmits data representing the adjusted voltage measurement to another adjacent monitor.

4. The monitoring system of claim 1, wherein the monitors are mutually connected by a daisy chain communication network.

5. The monitoring system of claim 1, wherein a first monitor is coupled to an external reference voltage source.

6. An integrated circuit, comprising:
a plurality of detectors to locally measure a first group of channels, one of said channels being an overlap channel;
a receiver to receive measurement data from another integrated circuit, representing a measurement of the overlap channel;
a controller to calculate a correction factor based on a local measurement of the overlap channel and the received measurement data to correct all first group measurements with the correction factor.

7. The circuit of claim 6, wherein channels are battery cells.

8. The circuit of claim 6, further comprising:
a transmitter operable to transmit a corrected local measurement of a second channel to another integrated circuit.

9. The circuit of claim 7, wherein each detector has a pair of inputs, a cathode terminal input and an anode terminal input.

10. The circuit of claim 6, further comprising:
a multiplexer to multiplex measurement signals from the detectors; and
an analog to digital converter coupled to the multiplexer.

11. The circuit of claim 6, further comprising:
an internal reference voltage.

12. A calibration method for an integrated circuit, comprising:
locally measuring voltages on a plurality of inputs of the integrated circuit, one of said voltages being an overlap voltage;
receiving data representing a measurement, taken by another integrated circuit, of the overlap voltage;
generating a correction factor, by a controller within the integrated circuit, from the received measurement data and a local measurement of the overlap voltage; and
adjusting, by the controller, the locally measured voltages by the correction factor.

13. The method of claim 12, further comprising transmitting data representing an adjusted locally measured voltage to an adjacent integrated circuit.

14. The method of claim 12, further comprising transmitting data representing the adjusted locally measured voltages to a system controller.

15. The method of claim 12, wherein the received measurement data is received from an adjacent integrated circuit.

16. An integrated circuit, comprising:
a plurality of detectors to measure a first group of channels with a coupled external reference voltage source, one of said channels being an overlap channel; and
a transmitter to transmit a local measurement of the overlap channel to another integrated circuit, wherein the transmitted local measurement of the overlap channel and a second measurement of the overlap channel taken by the other integrated circuit are used to calculate a correction factor for the other integrated circuit.

17. The circuit of claim 16, wherein channels are battery cells.

18. The circuit of claim 17, wherein each detector has a pair of inputs, a cathode terminal input and an anode terminal input.

19. The circuit of claim 16, further comprising:
a multiplexer to multiplex measurement signals from the detector; and
an analog to digital converter coupled to the multiplexer.

20. A system controller, comprising:
a receiver to receive measurements, taken by a plurality of monitoring devices, of respective components of a component stack, wherein adjacent monitoring devices each measure a common overlapping component; and
a processor to adjust all received measurements based on common overlapping component measurements taken by adjacent monitoring devices.

21. The system controller of claim 20, wherein the components are battery cells.

22. The system controller of claim 20, wherein the controller and plurality of monitoring devices are mutually connected by a daisy chain communication network.

23. The system controller of claim 20, wherein one of the plurality of monitoring devices is coupled to an external reference voltage.

24. A method, comprising:
receiving a first set of measurement signals from a first circuit, one of said first signals being a first overlap measurement signal representing a measurement of an overlap component taken by the first circuit;

receiving a second set of measurement signals from a second circuit, one of said second signals being a second overlap measurement signal representing a measurement of the overlap component taken by the second circuit;

calculating a correction factor based on the first and second overlap measurement signals; and adjusting, by a controller, the second set of measurement signals based on the correction factor.

25. The method of claim 24, wherein the measurement signals are battery cell measurements.

26. The method of claim 24, wherein the first set of measurement signals are based on an external reference voltage.

* * * * *